(12) United States Patent
Miwa (10) Patent No.: US 7,017,609 B2
(45) Date of Patent: Mar. 28, 2006

(54) GAS SUPPLY UNIT

(75) Inventor: Toshikazu Miwa, Kasugai (JP)

(73) Assignee: CKD Corporation, Komaki (JP)

( * ) Notice: Subject to any disclaimer, the term of this patent is extended or adjusted under 35 U.S.C. 154(b) by 197 days.

(21) Appl. No.: 10/662,338

(22) Filed: Sep. 16, 2003

(65) Prior Publication Data

US 2004/0173151 A1    Sep. 9, 2004

(30) Foreign Application Priority Data

Sep. 20, 2002   (JP)   ............................. 2002-274704

(51) Int. Cl.
*F16K 11/10*   (2006.01)

(52) U.S. Cl. ..................................................... 137/884

(58) Field of Classification Search ................ 137/269, 137/270, 597, 884
See application file for complete search history.

(56) References Cited

U.S. PATENT DOCUMENTS 6,123,340 A * 9/2000 Sprafka et al. ............. 277/608
6,273,139 B1 * 8/2001 Ohmi et al. ................. 137/884
6,659,131 B1 * 12/2003 Tsourides .................... 137/884

\* cited by examiner

*Primary Examiner*—John Fox
(74) *Attorney, Agent, or Firm*—Oliff & Berridge, PLC (57) ABSTRACT

A gas supply unit includes fluid control devices and piping blocks so that the fluid control devices are mounted on the upper surfaces of the piping blocks and thus connected with each other, constituting a part of a gas supply line. A filter block including a filter element in a passage providing communication between the fluid control device and the piping block is connected between the fluid control device and the piping block.

8 Claims, 10 Drawing Sheets

GAS SUPPLY UNIT

BACKGROUND OF THE INVENTION

1. Field of the Invention

The present invention relates to a gas supply unit for supplying gas to be used in a semiconductor manufacturing process.

2. Description of Related Art

Heretofore, several kinds of corrosive supply gases have been used in a manufacturing process of semiconductors or others. A gas supply unit is used as a part of a gas supply line which supplies the several kinds of supply gases (see, for example, Japanese patent unexamined publication No. 2001-153289).

Figure 15:
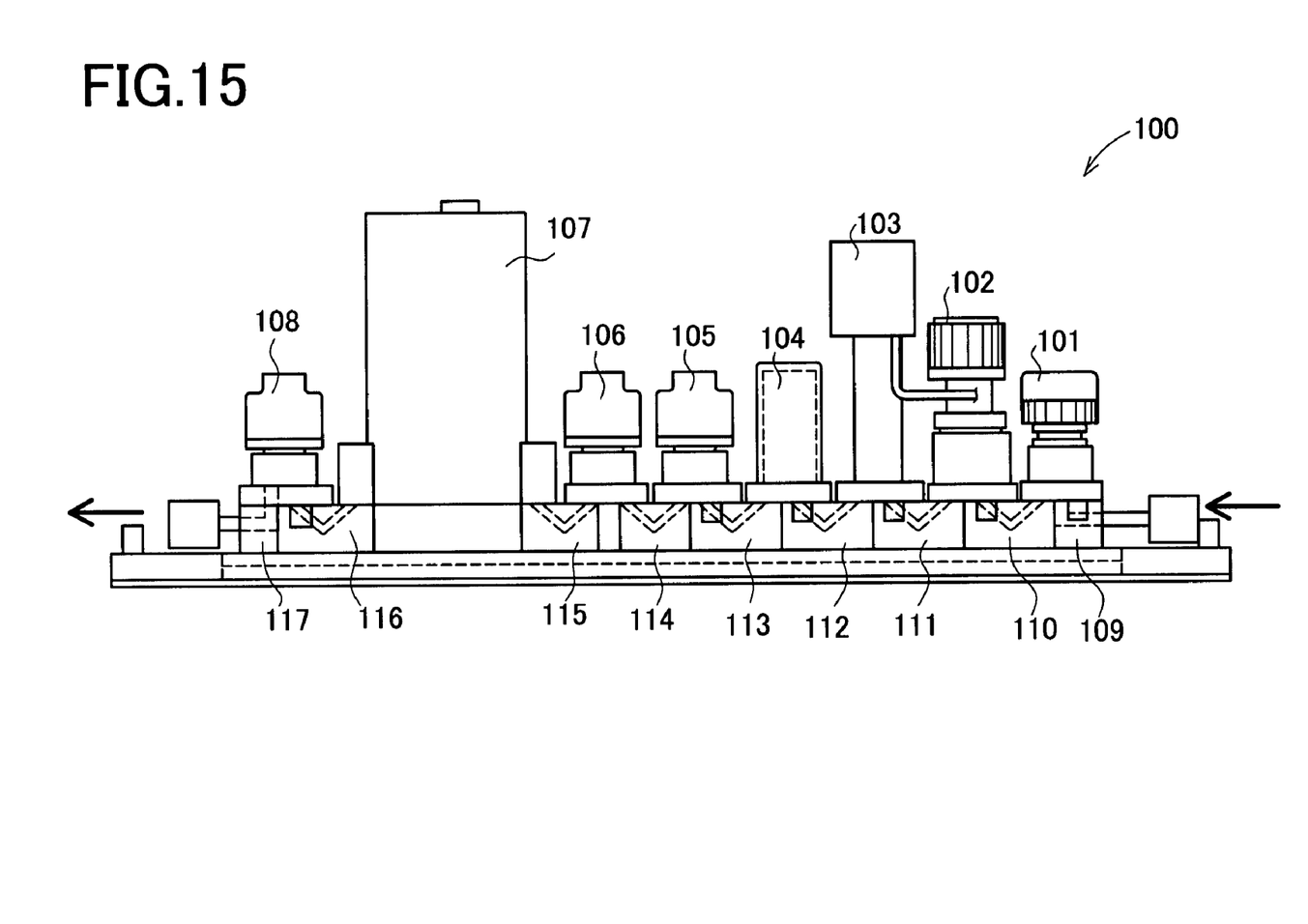
FIG. 15 is a view showing an example of a conventional gas supply unit.

FIG. 15 is a view showing an example of a conventional gas supply unit 100.

The gas supply unit 100 includes fluid control devices, namely, a hand valve 101, a regulator 102, a pressure sensor 103, a filter 104, an inlet valve 105, a purge valve 106, a mass flow controller 107, and an outlet valve 108, which are connected with piping blocks 109, 110, 111, 112, 113, 114, 115, 116, and 117 each formed with a gas flow passage, constituting a part of the gas supply line for supplying the several kinds of supply gasses. Since such gas supply unit 100 needs no coupling members between the fluid control devices 101-108, a reduced installation area and a shortened passage length can be achieved.

However, the gas supply unit 100 of FIG. 15 has the following disadvantages.

Specifically, in the gas supply unit 100, the fluid control devices 101–108 are mounted on upper surfaces of the piping blocks 109–117 to construct a passage for supply gas. Thus, the filter 104, for example, which is one of the fluid control devices 101–108, has to be connected with two piping blocks 112 and 113. For installation in the gas supply line, the gas supply unit 100 needs an installation space of the fluid control devices 101–108 and the piping blocks 109–117, leading to an increase in occupied area. The number of components such as the fluid control devices 101–108 and the piping blocks 109–117 is large, which would cause a problem of an increase in weight of the gas supply unit 100 itself. In particular, a plurality of the gas supply units 100 are generally used in adjacently arranged rows. The above problems of the occupied area and weight become more marked every increase in number of the gas supply units 100 to be used in the gas supply line.

In the gas supply unit 100, changing the placement of the filter 104 would be troublesome. Specifically, for instance, to change the placement of the filter 104 from an upstream side of the inlet valve 105 to another upstream side of the regulator 102, the conventional gas supply unit 100 needs the following steps of: demounting the regulator 102, the pressure sensor 103, and the filter 104 from the piping blocks 110–113 respectively; displacing the regulator 102 and the pressure sensor 110 downstream and connecting them with the piping blocks 111–113; and then connecting the filter 104 with the piping blocks 110 and 111, thus newly arranging the order of the regulator 102, the pressure sensor 103, and the filter 104. Such changing of the placement would take much time.

SUMMARY OF THE INVENTION

The present invention has been made in view of the above circumstances and has an object to overcome the above problems and to provide a gas supply unit, compact, light weight, and easy to change the placement.

To achieve the purpose, the invention provides a gas supply unit for supplying gas to two or more fluid control devices, including: a piping block which connects the fluid control devices with each other to constitute a part of the gas supply line; and a filter block including a filter element, the filter block being connected between the fluid control device and the piping block.

According to another aspect, the invention provides a gas supply unit for supplying gas to two or more fluid control devices, including: a piping block which connects the fluid control devices with each other to constitute a part of the gas supply unit; and a filter block including a filter element, the filter block being connected between the fluid control device and the piping block and provided with a passage which provides communication between the fluid control device and the piping block, and the filter element being placed in the passage.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

First Embodiment

Figure 1:
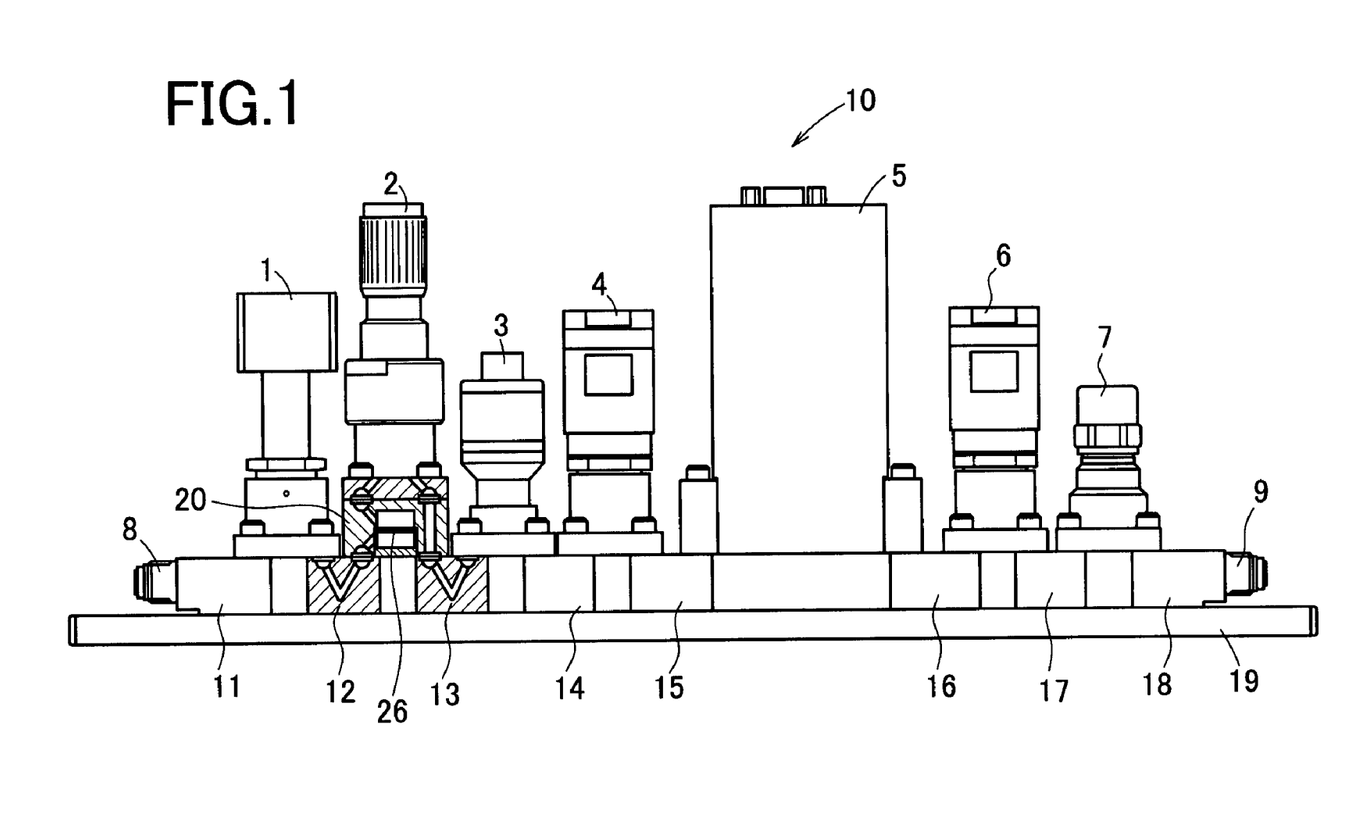
FIG. 1 is a side view of a gas supply unit in a first embodiment of the present invention, in which a filter element is placed upstream of a regulator.

A detailed description of a first preferred embodiment of a gas supply unit embodying the present invention will now be given referring to the accompanying drawings. FIG. 1 is a side view of a gas supply unit 10 in which a filter element 26 is placed upstream of a regulator 2 in a flow of supply gas.

The gas supply unit 10 includes fluid control devices, namely, a hand valve 1, a regulator 2, a pressure transducer 3, a cutoff valve 4, a mass flow controller 5, a purge valve 6, and a check valve 7, which are modules arranged in this order and mounted on a base member 19. These modules are connected with one another through piping blocks 11–18 in the same manner as in the conventional gas supply unit 100 (see FIG. 15) and constitute a part of the gas supply line. The base member 19 in the present embodiment may be a base plate or a rail.

The gas supply unit 10 in the first embodiment differs from the conventional gas supply unit 100 in that the modules constituting the gas supply unit 10 do not include the filter 104. The filter 104 is an essential element in the gas supply line to remove impure ingredients from the supply gas supplied to the gas supply line; however, in the gas supply unit 10 in the first embodiment, this filter 104 is not modularized as the hand valve 1 and the regulator 2 and is substituted with a new filter block 20 with a built-in filter function.

In the conventional gas supply unit 100 shown in FIG. 15, the supply gas having passed through the hand valve 101 is supplied in sequence to the regulator 102, the piping block 111, the pressure sensor 103, the piping block 112, and the filter 104 which removes impure ingredients. The supply gas is then allowed to sequentially flow in the piping block 113, the inlet valve 105, the piping block 114, the purge valve 106, the piping block 115, the mass flow controller 107, the piping block 116, and the outlet valve 108. At this time, the modules 101–106 are directly mounted on the top surfaces of the piping blocks 109–115 respectively. On the other hand, proposed is the gas supply unit 10 in the first embodiment shown in FIG. 1 in which the filter block 20 with the built-in filter function is placed between one of modules 1–4 and adjacent two of the piping blocks 11–15.

Figure 2:
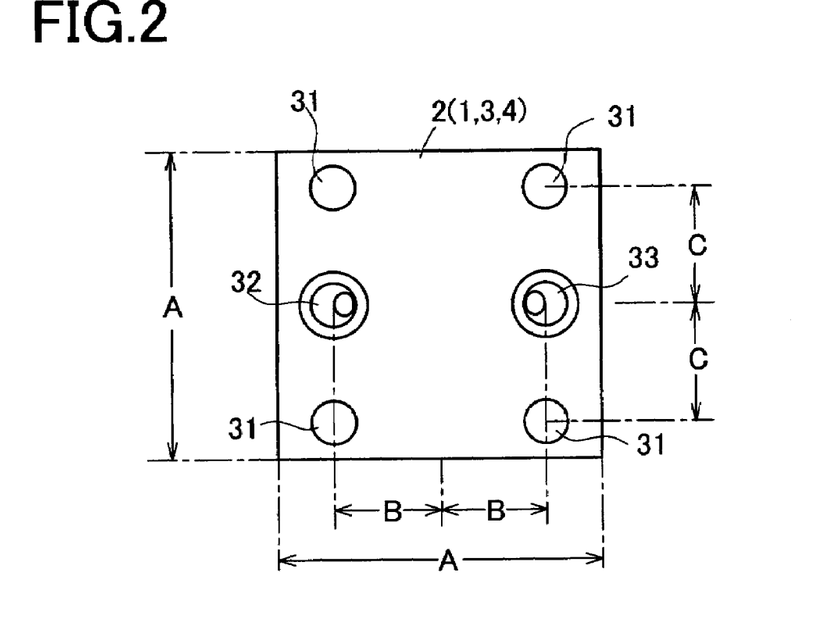
FIG. 2 is a bottom view of the regulator.

FIG. 2 is a bottom view of the regulator 2.

The bottom surface of the regulator 2 is of a square shape whose side has a length A. At four corners of the bottom surface, mounting holes 31 are formed. These mounting holes 31 are located symmetrically about and at a distance B from the midpoint of a side of the bottom surface of the regulator 2 in a longitudinal direction of the gas supply unit 10 (in a right and left direction in the figure), and besides located symmetrically about and at a distance C from the midpoint of another side of the bottom surface in a width direction of the gas supply unit 10 (in an up and down direction in the figure). The regulator 2 is formed with an inlet port 32 and an outlet port 33 located symmetrically about and at a distance B from the side of the bottom surface of the regulator 2 in the longitudinal direction of the gas supply unit 10 (in the right and left direction in the figure). Each opening of the inlet port 32 and the outlet port 33 is formed with a shoulder portion in which a gasket not shown is fitted.

Figure 3:
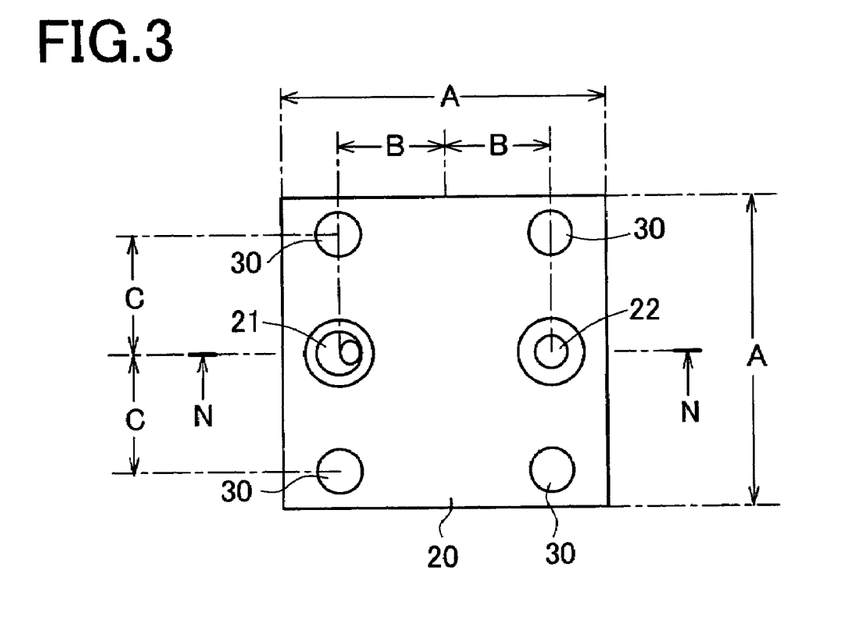
FIG. 3 is a top view of a filter block.
Figure 4:
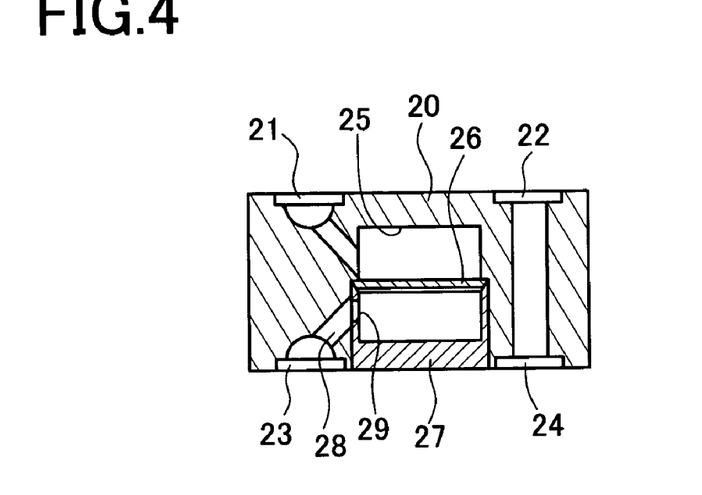
FIG. 4 is a sectional view of same taken along a line N—N in FIG. 3.
Figure 5:
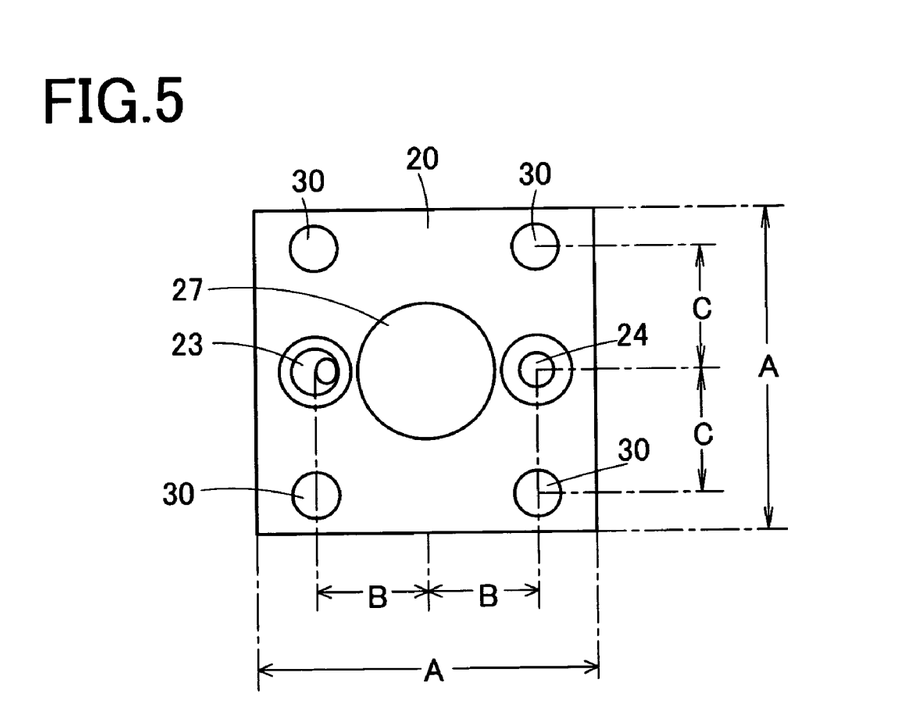
FIG. 5 is a bottom view of the filter block.

FIG. 3 is a top view of the filter block 20. FIG. 4 is a sectional view of same taken along the line N—N in FIG. 3. FIG. 5 is a bottom view of the filter block 20.

The filter block 20 is shaped in a rectangular parallelepiped having upper and lower surfaces each having a side of a length A. At four corners, the filter block 20 is formed with screw holes 30 to be aligned with the mounting holes 31 of the regulator 2. The screw holes 30 are used to secure the filter block 20 to the module 1–4 by screws not shown. Specifically, the screw holes 30 are located symmetrically about and at a distance B from the midpoint of a side of the filter block 20 in the longitudinal direction of the gas supply unit 10 (in the right and left direction in the figure), and besides located symmetrically about and at a distance C from the midpoint of another side in the width direction of the gas supply unit 10 (in the up and down direction in the figure).

On the upper surface of the filter block 20, there are formed ports 21 and 22 which are coupled with the inlet port 32 and the outlet port 33 of the regulator 2. These ports 21 and 22 are located symmetrically about and at a distance B from the midpoint of the side of the upper surface of the filter block 20 in the longitudinal direction of the gas supply unit 10 (in the right and left direction in the figure). Each opening of the ports 21 and 22 is formed with a shoulder portion in which a gasket not shown is fitted.

On the lower surface of the filter block 20, on the other hand, ports 23 and 24 are formed beneath the ports 21 and 22. Thus, the ports 23 and 24 are located symmetrically about and at a distance B from the midpoint of the side of the lower surface of the filter block 20 in the longitudinal direction of the gas supply unit 10 (in the right and left direction in the figure). Thus, the filter block 20 is provided with the ports 21 and 22 and the ports 23 and 24 which are located in the corresponding positions on the upper and lower surfaces, so that the filter block 20 may be mounted upside down without restriction in a vertical orientation. It is to be noted that each opening of the ports 23 and 24 is formed with a shoulder portion in which a gasket not shown is fitted.

The ports 21 and 23 are in communication with each other through a filter chamber 25. This filter chamber 25 is a circular hole made in the lower surface of the filter block 20. In this filter chamber 25, a metallic filter element 26 is set on a roof side. The filter element 26 is pressed by a filter holder 27 inserted from the lower surface side of the filter chamber 25 to close it. The filter element 26 is thus held in place. To prevent leakage of gas from the filter chamber 25, the filter holder 27 is integrally fixed in the filter block 20 by welding to close a clearance therebetween. A passage 28 that communicates the port 23 has an opening in the inner wall surface of the filter chamber 25. Correspondingly, the filter chamber 25 is formed, in the cylindrical side wall, with a through hole 29 that communicates the passage 28.

Figure 6:
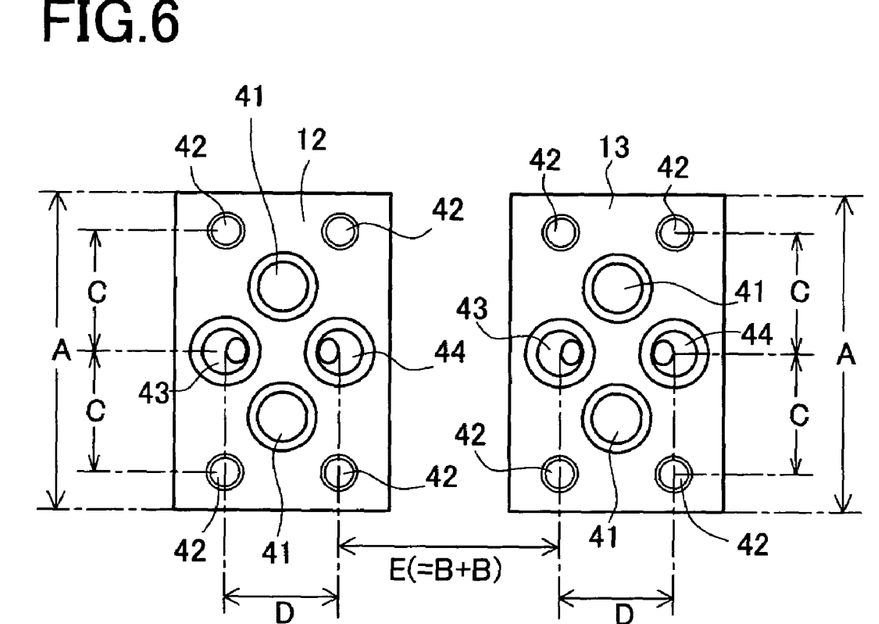
FIG. 6 is a top view of piping blocks.

FIG. 6 is a top view of the piping blocks 12 and 13.

The piping block 12 is shaped in a rectangular parallelepiped having a side of a length A in a longitudinal direction. At four corners of the block 12, screw holes 42 are formed for indirectly or directly securing the regulator 2 or other modules 1–7 to the piping block 12 by way of or not by way of the filter block 20. These screw holes 42 are located at a distance D from an adjacent one in the longitudinal direction of the gas supply unit 10 (in the right and left direction in the figure) and located symmetrically about and at a distance C from the midpoint of a side of the block 12 in the width direction of the gas supply unit 10 (in the up and down direction in the figure).

The piping block 12 is formed with through holes 41 and 41 used for securing the piping block 14 to the base member 19. On the upper surface of the piping block 12, there are formed ports 43 and 44 which communicate a V-shaped passage (see FIG. 1) and are located at a distance D from each other at the midpoint in the width direction of the gas supply unit 10 (in the up and down direction in the figure). It is to be noted that each port 43, 44 has an opening formed with a shoulder portion in which a gasket not shown is fitted.

It is to be noted that the piping block 13 is identical in structure to the piping block 12. The piping blocks 12 and 13 are mounted on the base member 19, keeping a distance E(=B+B) between the port 44 of the piping block 12 and the port 43 of the piping block 13.

Figure 7:
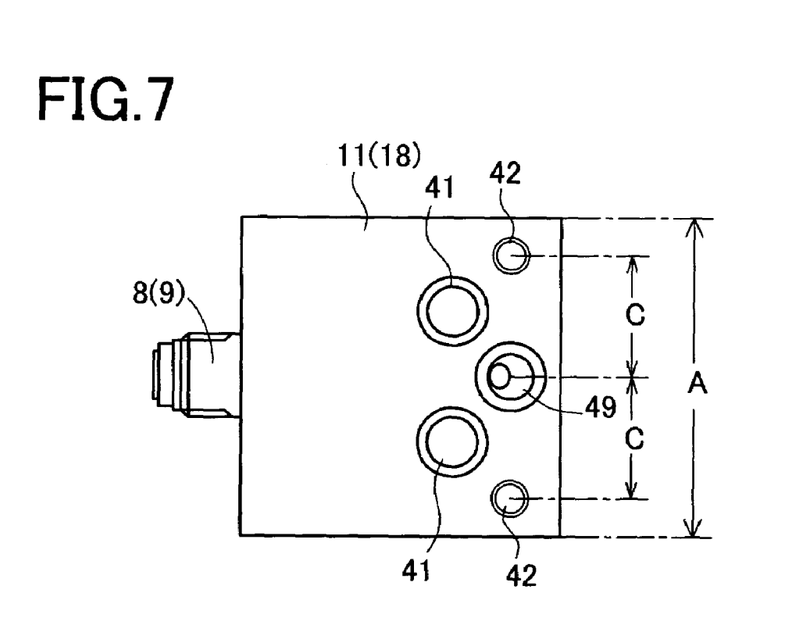
FIG. 7 is a top view of a piping block.

FIG. 7 is a top view of the piping block 11 (18).

The piping block 11 is formed with through holes 41, 41 and screw holes 42, 42 as with the piping block 12 and others. The screw holes 42 are located symmetrically about and at a distance C from the midpoint of a side of an upper surface of the piping block 11 in the width direction of the gas supply unit 10 (in the up and down direction in the figure). A port 49 is formed between the screw holes 42, 42. The port 49 is able to be coupled with an inlet port of the hand valve 1 and is in communication with an inlet 8. The port 49 has an opening formed with a shoulder portion in which a gasket not shown is fitted. Such piping block 11 is mounted on the base member 19 at a distance E(=B+B) between the port 49 and the port 43 of the piping block 12.

It is to be noted that the piping block 18 is also identical in structure to the piping block 11.

In the gas supply unit 10 in FIG. 1, the piping blocks 11–18 are mounted on the base member 19 so that the ports of the piping blocks 11 to 18 are located at a distance E(B+B) each, the modules 1–7 are placed on the upper surfaces of the piping blocks 11–18 by way of gaskets not shown and secured to the piping blocks 11–18 by screws put from above. At this time, the filter block 20 is placed between the regulator 2 and the piping blocks 12 and 13, constituting a part of the gas supply line. The port 21 of the filter block 20 is coupled with the inlet port 33 of the regulator 2, so that the filter element 26 is placed upstream of the regulator 2 in a flow of supply gas. The inlet 8 of the gas supply unit 10 is coupled with a gas supply source while an outlet 9 is coupled with a chamber through piping. The gas supply units 10 each constructed as above are arranged in the number determined according to the kind of supply gas. Each unit 10 is connected through piping to constitute a gas supply circuit.

Consequentially, the flow of supply gas in one of the gas supply units 10 constituting the gas supply circuit is described. The supply gas flowing in the gas supply unit 10 through the inlet 8 is delivered in sequence to the hand valve 1 and the regulator 2; during this time the supply gas is filtered by the filter block 20 to remove impure ingredients. The supply gas from which the impure ingredients have been removed is delivered to the pressure transducer 3 and then the cutoff valve 4. At this time, the pressure transducer 3 monitors the pressure of the supply gas flowing through the pressure transducer 3. The supply gas flows in the mass flow controller 5 to be controlled to a predetermined flow amount. The supply gas controlled to a set pressure and a set flow amount is delivered to the purge valve 6 and the check valve 7, and then to the chamber through the outlet 9. Since the supply gas has been filtered on an upstream side of the regulator 2 to remove impure ingredients, internal narrow passages in the regulator 2 and the mass flow controller 5 can be prevented from becoming clogged.

To more securely prevent the clogging of the mass flow controller 5, the filter element 26 is preferably placed upstream of the mass flow controller 5. In this case, the cutoff valve 4 may be provided on the lower surface with mounting holes 31, an inlet port 32, and an outlet port 33 in identical positions to those in the regulator 2, as shown in FIG. 2, so that the placement of the filter block 20 may be changed from between the regulator 2 and the piping blocks 12 and 13 (see FIG. 1) to between the mass flow controller 5 and the piping blocks 14 and 15 (see FIG. 8). Specifically, the regulator 2 and the filter block 20 are demounted from the piping blocks 12 and 13; only the regulator 2 is secured again to the piping blocks 12 and 13 by screws; the cutoff valve 4 is demounted from the piping blocks 14 and 15; the filter block 20 is placed between the cutoff valve 4 and the piping blocks 14 and 15; and the cutoff valve 4 and the filter block 20 are secured to the piping blocks 14 and 15 by screws.

Figure 8:
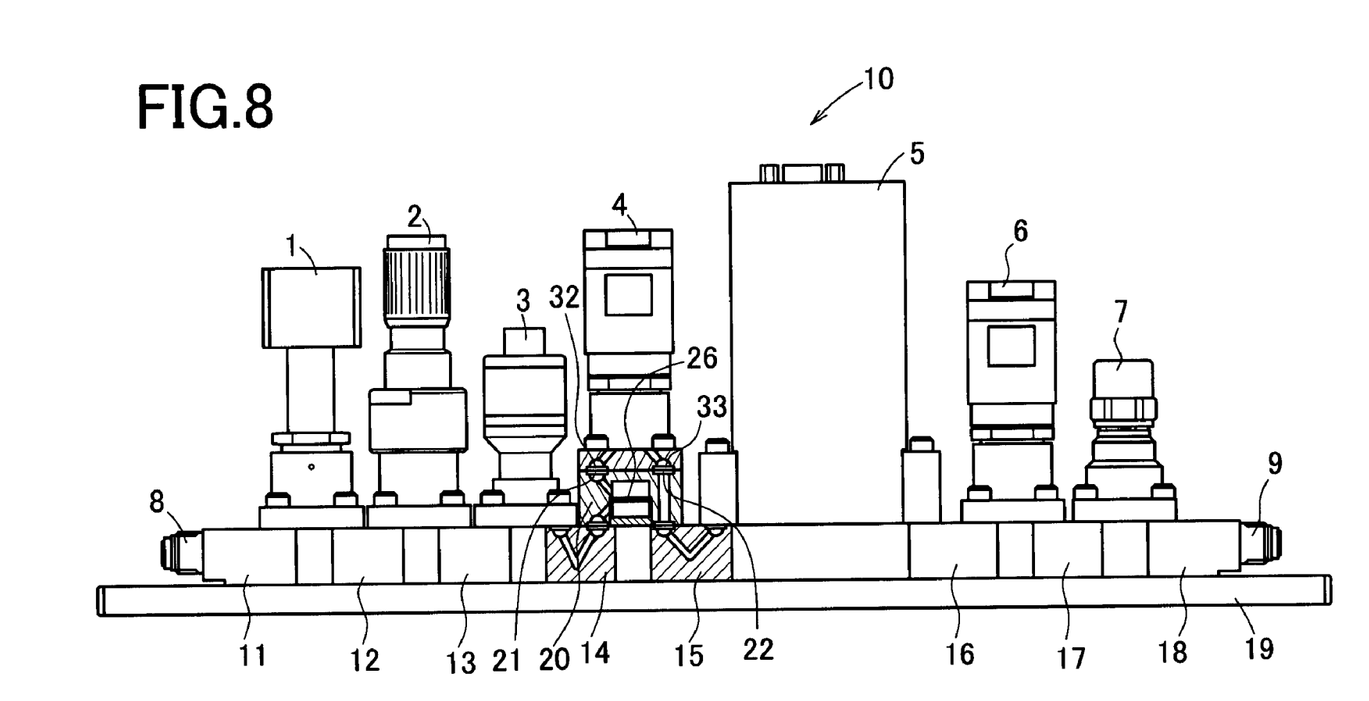
FIG. 8 is a side view of the gas supply unit, in which the filter element is placed upstream of a cutoff valve in a flow of supply gas.

At this time, as shown in FIG. 8, when the filter block 20 is placed between the cutoff valve 4 and the piping blocks 14 and 15 so that the port 21 of the filter block 20 is coupled with the inlet port 32 of the cutoff valve 4 and the port 22 of the filter block 20 is coupled with the outlet port 33 of the cutoff valve 4, the filter element 26 is placed upstream of the cutoff valve 4 in the flow of supply gas. In this case, even when supply gas is adhered to the filter chamber 25 of the filter block 20 and the filter element 26 after purging of the gas supply unit 10, no gas leakage will occur if only the cutoff valve 4 is closed during maintenance or other operations wherein the mass flow controller 5 is demounted from the piping block 15.

Figure 9:
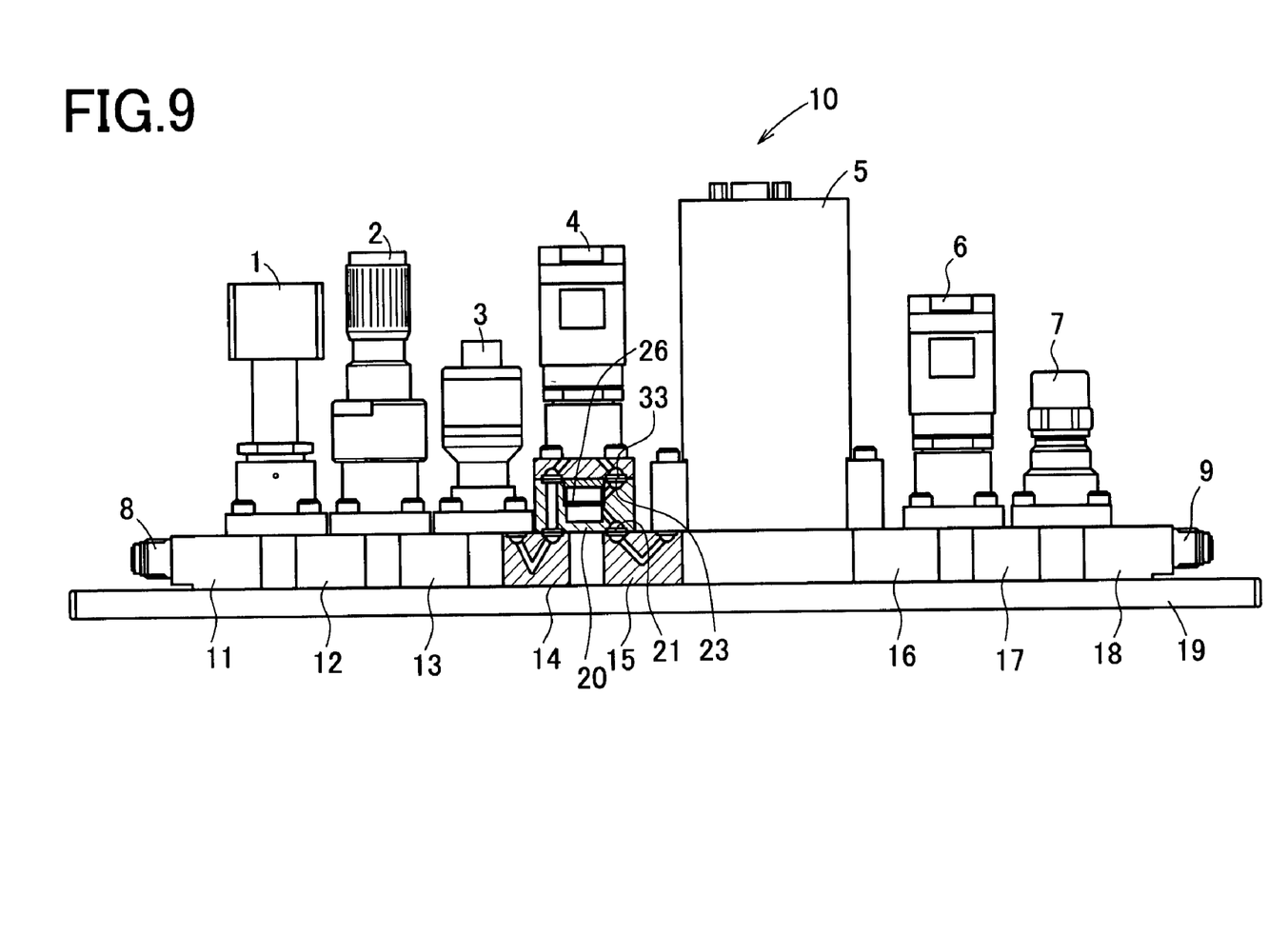
FIG. 9 is a side view of the gas supply unit, in which the filter element is placed downstream of a cutoff valve in the flow of supply gas.

In the filter block 20, the screw holes 31 are located in the corresponding positions on the upper and lower surfaces and the ports 21 and 22 and the ports 23 and 24 are also located in the corresponding positions on the upper and lower surfaces. Thus, the filter block 20 may be turned upside down from the orientation shown in FIG. 8 with respect to the cutoff valve 4 and can be secured between the cutoff valve 4 and the piping blocks 14 and 15 as shown in FIG. 9. At this time, the port 23 of the filter block 20 is coupled with the outlet port 33 of the cutoff valve 4 while the port 21 is coupled with the piping block 15. Thus, the filter element 26 is located downstream of the cutoff valve 4 in the flow of supply gas. In this case, just before entering the mass flow controller 5, the supply gas is filtered to remove impure ingredients therefrom. Accordingly, the mass flow controller 5 can be prevented from being clogged.

Figure 10:
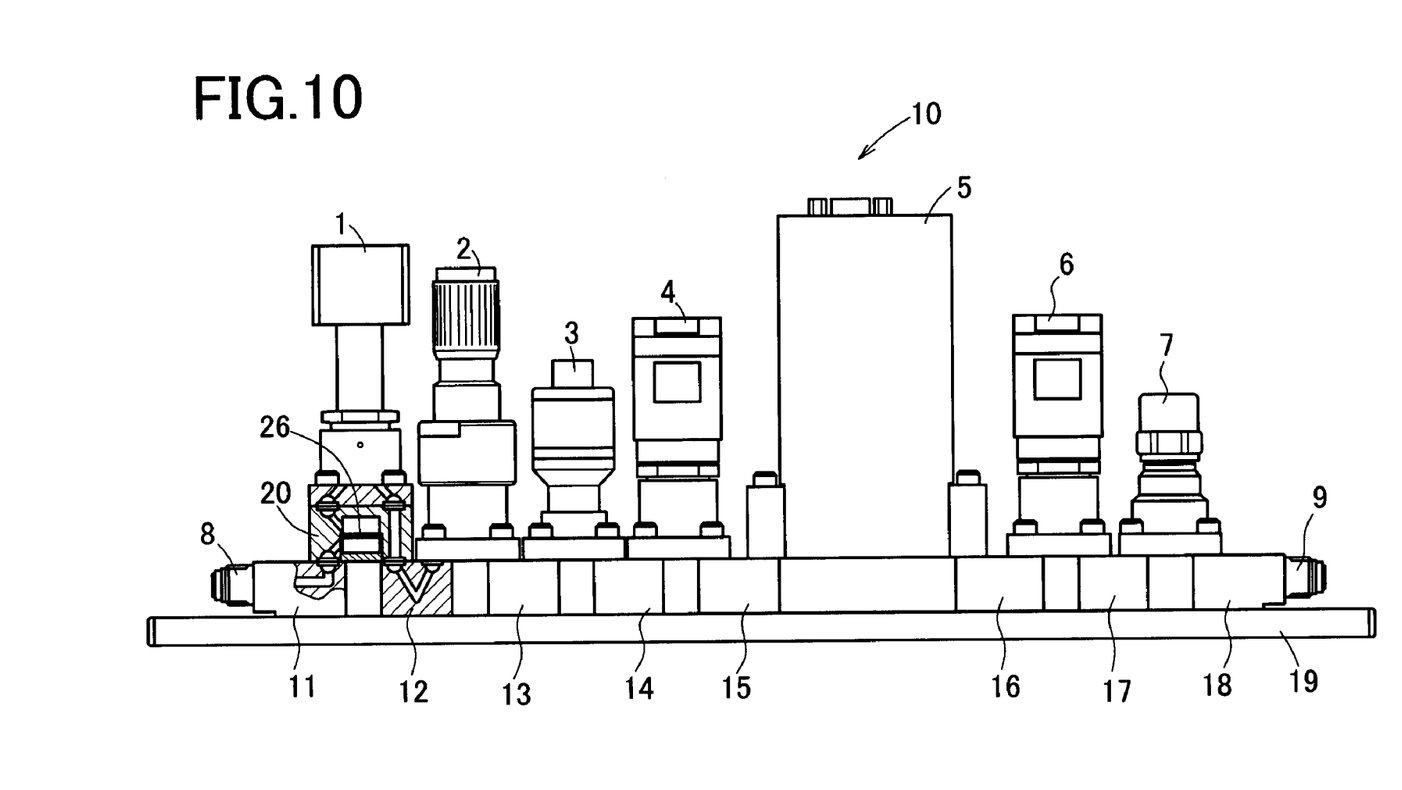
FIG. 10 is a side view of the gas supply unit, in which the filter element is placed upstream of a hand valve in the flow of supply gas.
Figure 11:
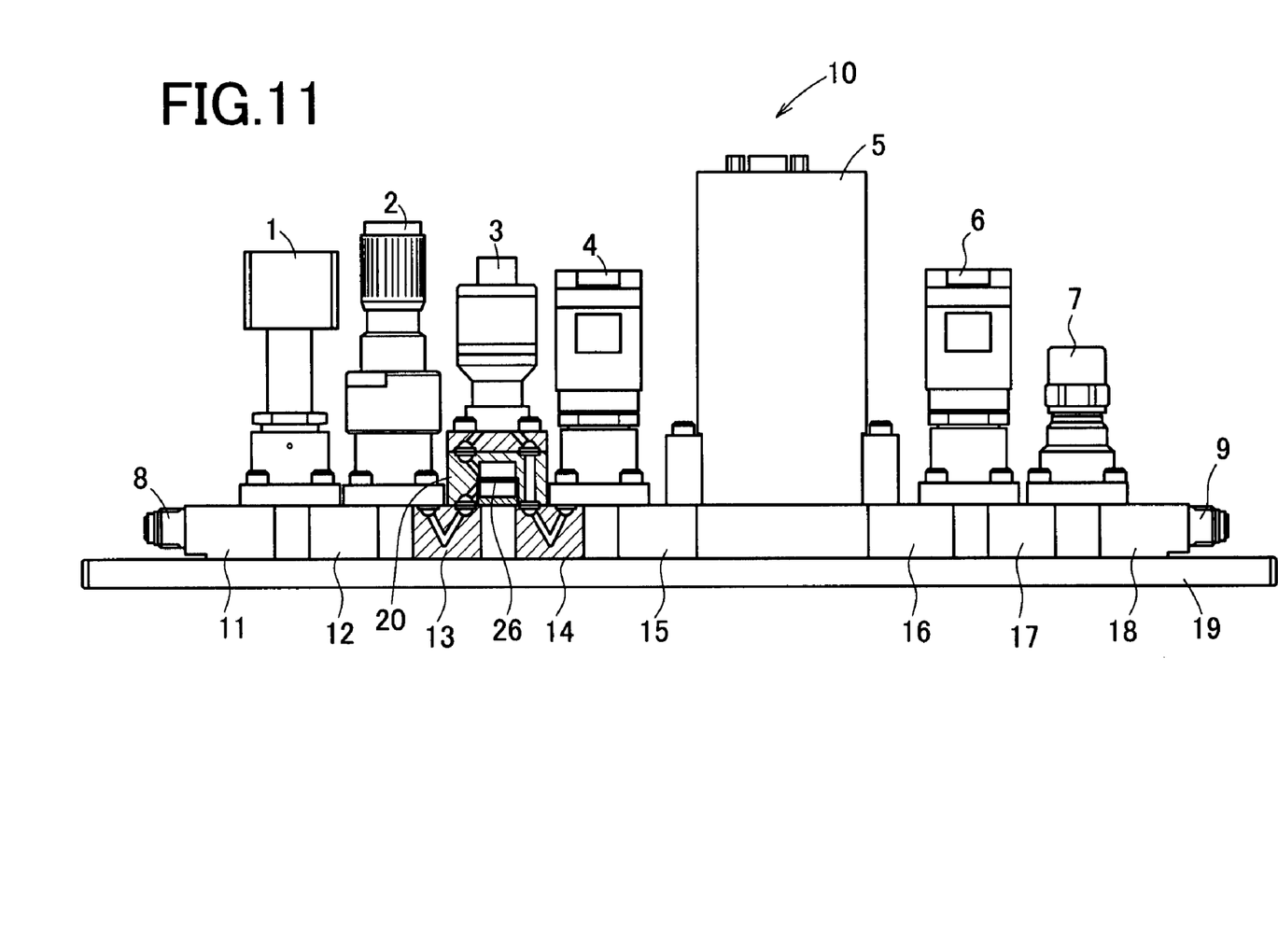
FIG. 11 is a side view of the gas supply unit, in which the filter element is placed upstream of a pressure transducer in the flow of supply gas.

It is to be noted that the hand valve 1 and the pressure transducer 3 may be provided on the lower surface with mounting holes 31, an inlet port 32, and an outlet port 33 in identical locations to those in the regulator 2, so that the placement of the filter block 20 may be changed to between the hand valve 1 and the piping blocks 11 and 12 (see FIG. 10) or between the pressure transducer 3 and the piping blocks 13 and 14 (see FIG. 11). Furthermore, the filter element 26 may selectively be mounted upstream and downstream of the hand valve 1 or the pressure transducer 3 in the flow of supply gas.

Consequently, according to the gas supply unit 10 in the first embodiment, the filter block 20 is placed between the fluid control device 1–7 and the piping blocks 11–15 (see FIG. 1), eliminating the use of the filter 104 (see FIG. 15) which is the conventional fluid control device connected with the piping blocks 112 and 113 and further removing one of the two piping blocks 112 and 113 for connection with the filter 104. Thus, the unit 10 can be reduced in total length to be compact in size and reduced in the number of components for weight saving. The filter block 20, which is placed between the fluid control device 1–4 and the piping blocks 11–15, can easily be changed in placement without changing the order of the fluid control devices 1–4.

At this time, each fluid control device 1–7 may have the lower surface with identical locations of an inlet port 32 and an outlet port 33 (see FIG. 2), so that the filter block 20 is connected with any fluid control devices 1–7 (see FIG. 1 and FIGS. 8 through 11). Accordingly, the placement of the filter block 20 can be freely selected according to the purpose of use.

Furthermore, the filter block 20 may be mounted upside down on the fluid control device 1–7 (see FIGS. 8 and 9). This makes it possible to selectively connect the filter element 26 upstream or downstream of each fluid control device 1–7 in the flow of supply gas.

Second embodiment

Figure 12:
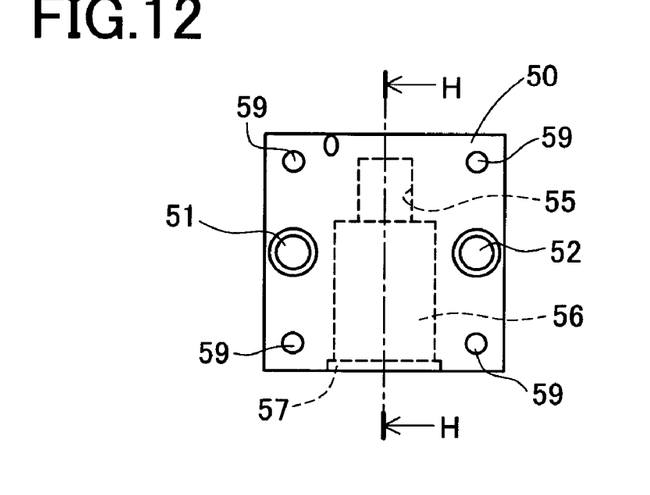
FIG. 12 is a top view of a filter block in a second embodiment of the present invention.
Figure 13:
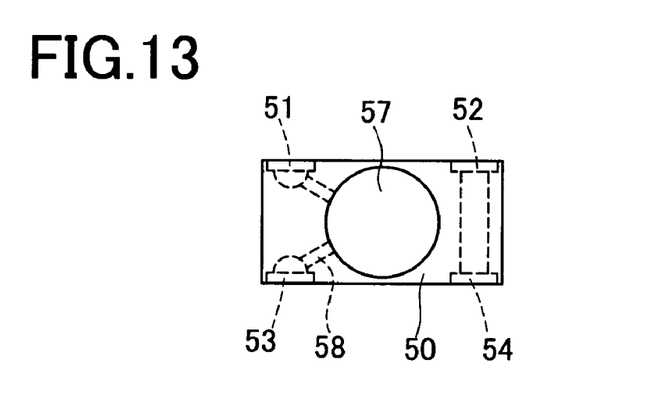
FIG. 13 is a side view of the filter block.
Figure 14:
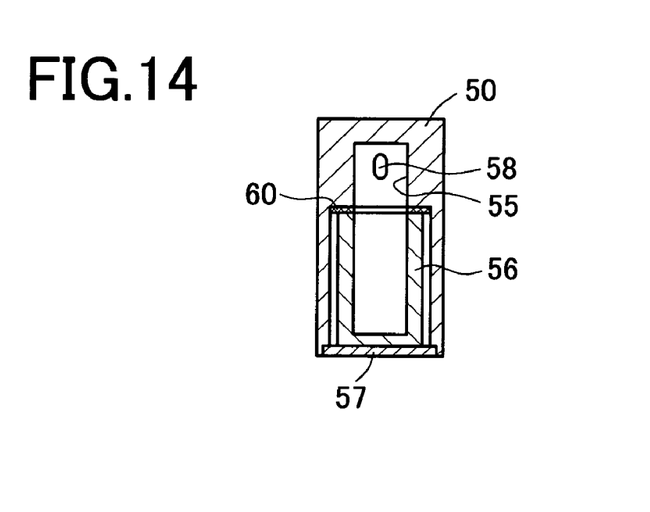
FIG. 14 is a sectional view of same taken along a line H—H in FIG. 12.

Next, a second embodiment of the gas supply unit according to the present invention will be described with reference to the attached drawings. The second embodiment differs from the first embodiment in the structure of a filter block, which is explained in detail here. FIG. 12 is a top view of a filter block 50. FIG. 13 is a side view of the filter block 50. FIG. 14 is a sectional view of same taken along the line H—H in FIG. 14.

The filter block 50 to be used in the gas supply system in the second embodiment includes a filter chamber 55 formed to be open in the side surface of the filter block 50 and a metallic filter element 56 fit in the filter chamber 55 from side. The filter element 56 is of a cylindrical shape whose one end is closed. A ring plate 60 is fixed on the other open end of the filter element 56 and fit in place in the filter chamber 55. The opening of the filter chamber 55 is covered with a lid 57. Thus, the filter block 50 holding the filter element 56 between ports 51 and 53 is constructed. Ports 51–54 of the filter block 50 are formed in the corresponding positions on the upper and lower surfaces as with the ports 21–24 of the filter block 20 in the first embodiment. The filter block 50 is secured to the fluid control device 1–7 by bolts put through screw holes 59 so that the filter block 50 is placed between the fluid control device 1–7 and the piping blocks 11–15.

According to the gas supply unit using the filter block 50, as with the gas supply unit 10 in the first embodiment, the filter 104 (see FIG. 15) used as a conventional fluid control device connected with the piping blocks 112 and 113 is removed, which is accompanied by the removal of one of the two piping blocks 112 and 113 connected with the filter 104. Accordingly, the whole unit can be reduced in size and weight. Even in the case that a small-sized integrated unit is constructed, a sufficient fluid amount can be ensured without reducing a passage in a filter portion.

The present invention may be embodied in other specific forms without departing from the spirit or essential characteristics thereof.

(1) For instance, in the above embodiment, the inlet port 32 and the outlet port 33 are formed in line with the mounting holes 31 on the lower surface of each fluid control device 1–7; the ports 21–24 of the filter block 20 and the ports 51–54 of the filter block 50 are formed in line with the screw holes 30 and 50 respectively; and the port 43 and 44 of the piping blocks 12 and 13 are formed in line with the screw hole 42, to efficiently squeeze a gasket placed between the fluid control device 1–7 and the filter block 20 or the piping blocks 12 and 13, thereby enhancing a sealing property. Alternatively, a gasket itself may be an elastic gasket having a good sealing property, in which each port, mounting hole, screw hole are formed in respective arbitrary positions.

(2) For example, in the first embodiment, the filter element 26 is disposed horizontally in the filter chamber 25. Alternative design is to use a filter element to be disposed at a slant in the filter chamber 25 in order to ensure a larger area of a filter portion.

(3) For example, in the second embodiment, the filter element 56 of a cylindrical shape is used. Instead thereof, the filter element 56 may be formed with a surface with projections and depressions to provide a larger area of the filter portion.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A gas supply unit for supplying gas to two or more fluid control devices, comprising:
    a piping block which connects the fluid control devices with each other to constitute a part of the gas supply unit; and
    a filter block including a filter element, the filter block being connected between the fluid control device and the piping block,
    wherein the filter block is capable of being connected in an upside-down state with the fluid control device.

2. The gas supply unit according to claim 1, wherein the fluid control device to be connected with the filter block is any one of a hand valve, a regulator, a pressure transducer, and a cutoff valve.

3. A gas supply unit for supplying gas to two or more fluid control devices, comprising:
    a piping block which connects the fluid control devices with each other to constitute a part of the gas supply unit; and
    a filter block including a filter element, the filter block being connected between the fluid control device and the piping block and provided with a passage which provides communication between the fluid control device and the piping block, and the filter element being placed in the passage,
    wherein the filter block is capable of being connected in an upside-down state with the fluid control device.

4. The gas supply unit according to claim 3, wherein the filter block is formed with a filter chamber in a part of the passage and the filter element is built in the filter chamber.

5. The gas supply unit according to claim 3, wherein the fluid control device to be connected with the filter block is any one of a hand valve, a regulator, a pressure transducer, and a cutoff valve.

6. A gas supply unit for supplying gas to two or more fluid control devices, comprising:
    a piping block which connects the fluid control devices with each other to constitute a part of the gas supply unit; and
    a filter block including a filter element, the filter block being connected between the fluid control device and the piping block,
    wherein the filter block comprises:
        a filter chamber in which the filter element is placed;
        a first port and a second port which are formed on an upper surface and connected to an inlet port and an outlet port, respectively, of one of the fluid control devices; and a third port and a fourth port which are formed on a lower surface and connected to ports of the piping block, and the first port and the third port communicating with each other through the filter element in the filter chamber, and the second port and the fourth port communicating with each other outside the filter chamber.

7. The gas supply unit according to claim 6, wherein the third port is formed just below the first port, and the fourth port is formed just below the second port.

8. A gas supply unit for supplying gas to two or more fluid control devices, including:

a plurality of piping blocks which connects the fluid control devices with each other to constitute a part of the gas supply unit; and a filter block including a filter element, the filter block being connected between the fluid control device and the plurality of piping blocks, wherein the filter block is placed over two of the piping blocks when one of the fluid control devices is mounted on the filter block.

\* \* \* \* \*